(12) United States Patent
RostamPisheh et al.

(10) Patent No.: US 8,572,332 B2
(45) Date of Patent: Oct. 29, 2013

(54) DE-INTERLEAVING MECHANISM INVOLVING A MULTI-BANKED LLR BUFFER

(75) Inventors: Ali RostamPisheh, San Diego, CA (US); Raghu N. Challa, San Diego, CA (US); Iwen Yao, San Diego, CA (US); Davie J. Santos, Encinitas, CA (US); Mrinal M. Nath, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 991 days.

(21) Appl. No.: 12/404,613

(22) Filed: Mar. 16, 2009

(65) Prior Publication Data

US 2009/0249134 A1    Oct. 1, 2009

Related U.S. Application Data

(60) Provisional application No. 61/040,591, filed on Mar. 28, 2008, provisional application No. 61/040,577, filed on Mar. 28, 2008.

(51) Int. Cl.
G06F 12/00    (2006.01)

(52) U.S. Cl.
USPC .......................... 711/154; 375/341

(58) Field of Classification Search
USPC .......................... 711/154; 375/341
See application file for complete search history.

(56) References Cited

U.S. PATENT DOCUMENTS

| | | | |
|---|---|---|---|
| 6,789,218 B1 * | 9/2004 | Edmonston et al. | 714/701 |
| 2004/0001564 A1 * | 1/2004 | Chan et al. | 375/341 |
| 2005/0190864 A1 * | 9/2005 | Pan et al. | 375/320 |
| 2007/0011593 A1 * | 1/2007 | Cho et al. | 714/794 |
| 2009/0245423 A1 * | 10/2009 | RostamPisheh et al. | 375/316 |

FOREIGN PATENT DOCUMENTS

| | | |
|---|---|---|
| CN | 101124796 A | 2/2008 |
| JP | 2004531138 A | 10/2004 |
| JP | 2008135813 A | 6/2008 |
| WO | 02093755 A1 | 11/2002 |
| WO | 2006069392 | 6/2006 |
| WO | 2006082923 A1 | 8/2006 |

OTHER PUBLICATIONS

Benedetto S et al: "Mapping Interleaving Laws to Parallel Turbo and LDPC Decoder Architectures" IEEE Transactions on Information Theory, IEEE, US, vol. 50, No. 9, Sep. 1, 2004, pp. 2002-2009, XP011118021 ISSN: 0018-9448 p. 2003, left-hand column; figures 2,3 1-42.

(Continued)

*Primary Examiner* — Hashem Farrokh
(74) *Attorney, Agent, or Firm* — Abdollah Katbab

(57) ABSTRACT

A de-interleaver generates a plurality of De-interleaved Reorder Physical (DRP) addresses to simultaneously write a corresponding plurality of LLR values into a multi-banked memory such that not more than one LLR value is written into each bank of the multi-banked memory at a time. A sequence of such parallel writes results in the LLR values of a transmission of a sub-packet being stored in the memory. Address translation performed during generation of the DRP addresses causes the LLR values to be stored within the banks such that a decoder can read LLR values out of the memory in a de-interleaved sequence. Each memory location of a bank is a word-location for storing multiple related LLR values, where one LLR value is stored along with its parity values. The ability to simultaneously write to multiple LLR values is used to clear locations in a fast and efficient manner.

37 Claims, 15 Drawing Sheets

(56) References Cited

OTHER PUBLICATIONS

International Search Report & Written Opinion—PCT/US2009/037453, International Search Authority—European Patent Office—Jul. 20, 2009.

Dinoi L., et al., "Variable-size interleaver design for parallel turbo decoder architectures", Communications, IEEE Transactions on, Nov. 2005, vol. 53, No. 11, pp. 1833-1840.
Jim Tomcik, "MBFDD and MBTDD Wideband Mode: Technology Overview", IEEE C802.20-05/68r1, Jan. 6, 2006.
Taiwan Search Report—TW098109565—TIPO—Feb. 7, 2013.

* cited by examiner

MULTI-BANKED LLR BUFFER (SEGMENT D11)

EXAMPLE 1:

PACKETSIZE = 65    65 = 16 X 4 + 1    5
                                      4
                                      4
                                      4  } NUMBER OF LLR VALUES
                                      .    STORED IN EACH BANK
                                      .
                                      .
                                      4

EXAMPLE 2:

PACKETSIZE = 4K    4K = 16 X 256    256 EACH BANK

PBRI ADDRESS LENGTH = 11

TIMELINE TO WRITE TWO SUB-PACKET LLR VALUES

SEGMENT OF MULTI-BANKED MEMORY

32 + 9 + 9 = 50 TIME UNITS

TIMELINE TO WRITE LLR VALUES OF TWO SUB-PACKETS

DDE CLEAR LLR TASK INSTRUCTION

US 8,572,332 B2

DE-INTERLEAVING MECHANISM INVOLVING A MULTI-BANKED LLR BUFFER

CROSS-REFERENCE TO RELATED APPLICATIONS

This application claims the benefit under 35 U.S.C. §119 of Provisional Application Ser. No. 61/040,591, filed Mar. 28, 2008, and of Provisional Application Ser. No. 61/040,577, filed Mar. 28, 2008, said two provisional applications are both incorporated herein by reference.

BACKGROUND INFORMATION

1. Technical Field

The disclosed embodiments relate to de-interleaving, and more particularly to de-interleaving utilizing a multi-banked memory.

2. Background Information

FIG. 1 (Prior Art) is a simplified block diagram of one type of conventional wireless communication device 1 such as a cellular telephone. Wireless communication device 1 includes an antenna 2, an RF transceiver integrated circuit 3, and a digital baseband integrated circuit 4. The digital baseband integrated circuit 4 contains a modular transmit channel (TX) 5 and a modulator receive channel (RX) 6. If the device 1 is transmitting, then information 7 to be transmitted passes through the modulator transmit channel 5 which includes an encoder circuit 8, a mapper circuit 9, a modulator circuit 10, an Inverse Fast Fourier Transform (IFFT) circuit 11, and a windowing circuit 12. The information is converted into analog form by Digital-to-Analog Converter (DAC) 13, and passes through RF transceiver integrated circuit 3, for transmission from antenna 2. Because the information may be degraded during transmission by impairments such as thermal noise, interference, and spurious signals, the information is encoded and interleaved before transmission. Encoding and interleaving techniques are employed to allow a receiving wireless communication device to perform de-interleaving and decoding to recover degraded or impaired information.

The structure of a receiving wireless communication device that receives the transmission may be the same as the structure set forth in FIG. 1. The transmission is received on antenna 2, and passes through RF transceiver integrated circuit 3, is converted into digital form by an Analog-to-Digital Converter (ADC) 14, and passes through modular receive channel (RX) 6. Receive channel 6 includes a front end circuit 15, a Fast Fourier Transform (FFT) circuit 16, a demodulator circuit 17, a DEMAP circuit 18, a Log-Likelihood Ratio (LLR) buffer 19, and a decoder circuit 20. The DEMAP circuit 18 in turn includes unpaint circuit 21, an LLR generator circuit 22, a descrambler circuit 23, and a de-interleaver circuit 24. De-interleaver circuit 24 may, for example, receive a stream of interleaved LLR values, de-interleave the stream, and write the LLR values into buffer 19 in de-interleaved fashion. Decode circuit 20 reads the LLR values from buffer 19 and performs decoding on the values, thereby recovering the originally transmitted information represented by arrow 25. As data throughput requirements on such wireless communication devices increase, ever faster and more efficient de-interleaving methods and structures are required. Thus an improved de-interleaving process is desired.

SUMMARY

In a first aspect, a de-interleaver mechanism (for example, within in a radio receiver of a cellular telephone) generates a plurality of De-interleaved Reorder Physical (DRP) addresses. The plurality of DRP addresses are used to simultaneously write a corresponding plurality of Log-Likelihood Ratio (LLR) values into a multi-banked memory such that not more than one LLR value is written into each bank of the multi-banked memory at a time. A sequence of such parallel writes results in the LLR values of a transmission of a sub-packet being stored in the multi-banked memory. Address translation performed by the de-interleaver mechanism during generation of the DRP addresses causes the LLR values to be stored within the banks such that a decoder can read LLR values out of the memory in a sequence that results in de-interleaving. Each memory location of a bank is a word-location for storing multiple LLR values. The multiple LLR values may include an LLR value along with its associated parity LLR values.

In a second aspect, multiple LLR values are simultaneously cleared. Not only are LLR values in multiple different banks cleared simultaneously in parallel write operations, but multiple LLR values stored in a word-location are also cleared simultaneously. A single clear instruction can cause the clearing of sub-packet regions for multiple sub-packets, thereby reducing processing burden on a central processing circuit that controls the LLR writing and LLR clearing operations.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 9 also illustrates an example of an outgoing stream of de-interleaved LLR values that passes out of the de-interleaver circuit 223 of FIG. 5.

DETAILED DESCRIPTION

Figure 1:
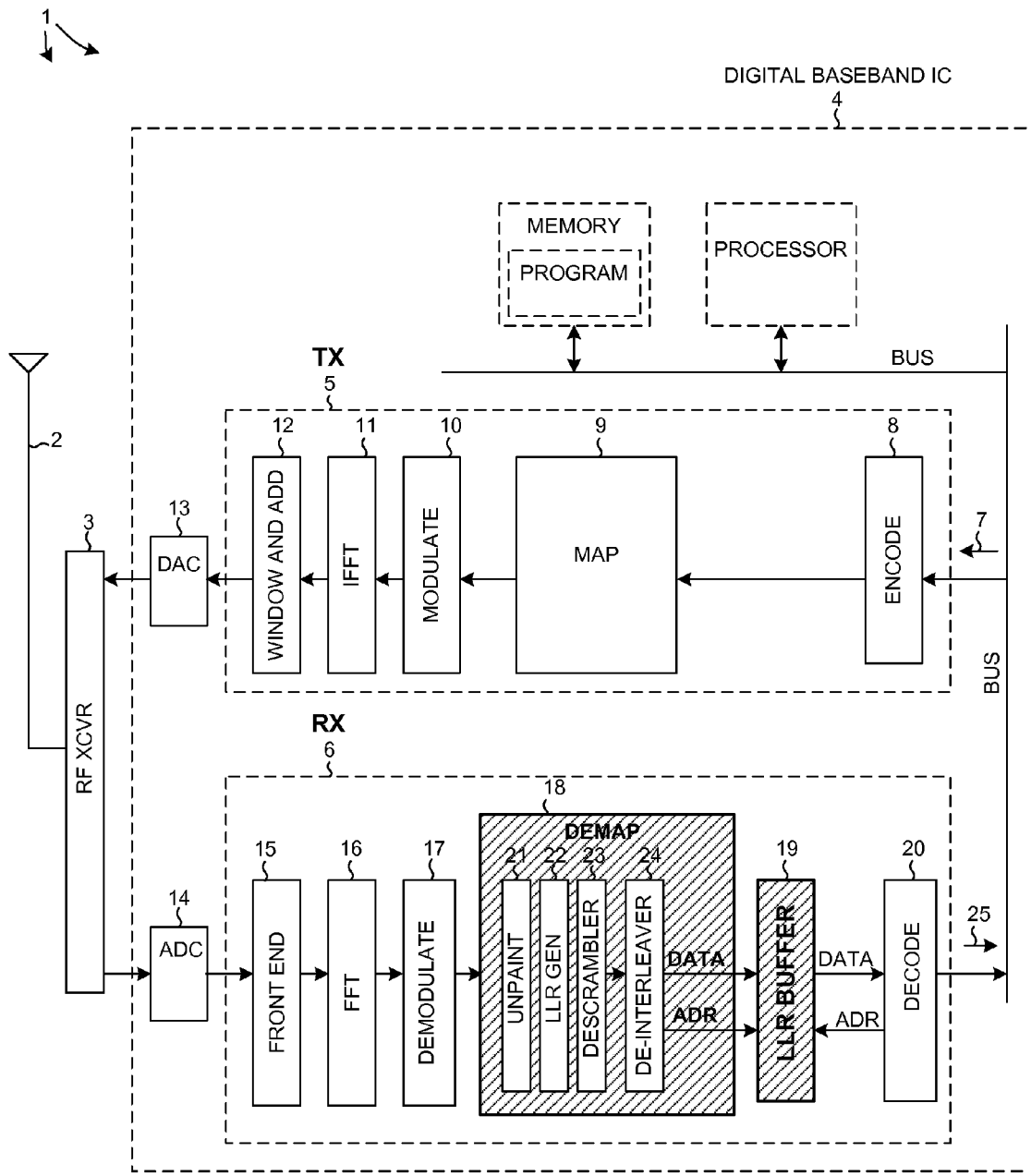
FIG. 1 (Prior Art) is a simplified diagram of a mobile communication device.
Figure 2:
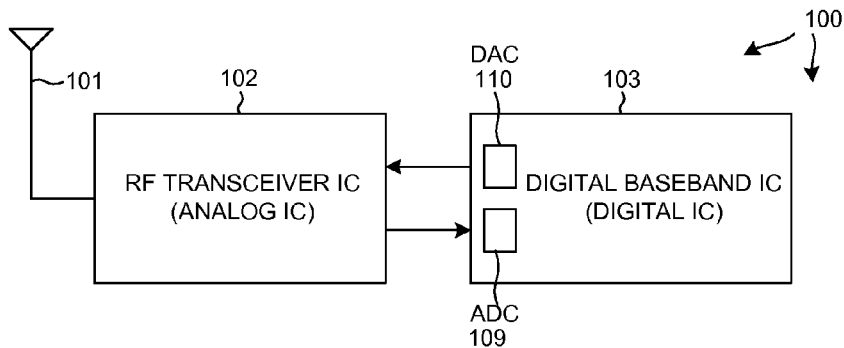
FIG. 2 is a simplified high level block diagram of one particular type of mobile communication device.

FIG. 2 is a very simplified high level block diagram of one particular type of mobile communication device. In this particular example, mobile communication device 100 is a cellular telephone. Mobile communication device 100 includes (among several other parts not illustrated) an antenna 101 and two integrated circuits 102 and 103. Integrated circuit 102 is an RF transceiver integrated circuit. RF transceiver integrated circuit 102 includes a transmitter and a receiver. RF transceiver integrated circuit 102 is principally an analog integrated circuit involving analog circuitry. Integrated circuit 103, on the other hand, is principally a digital integrated circuit that includes digital circuitry. Integrated circuit 103 is called a "digital baseband integrated circuit" or a "baseband processor integrated circuit".

Figure 3:
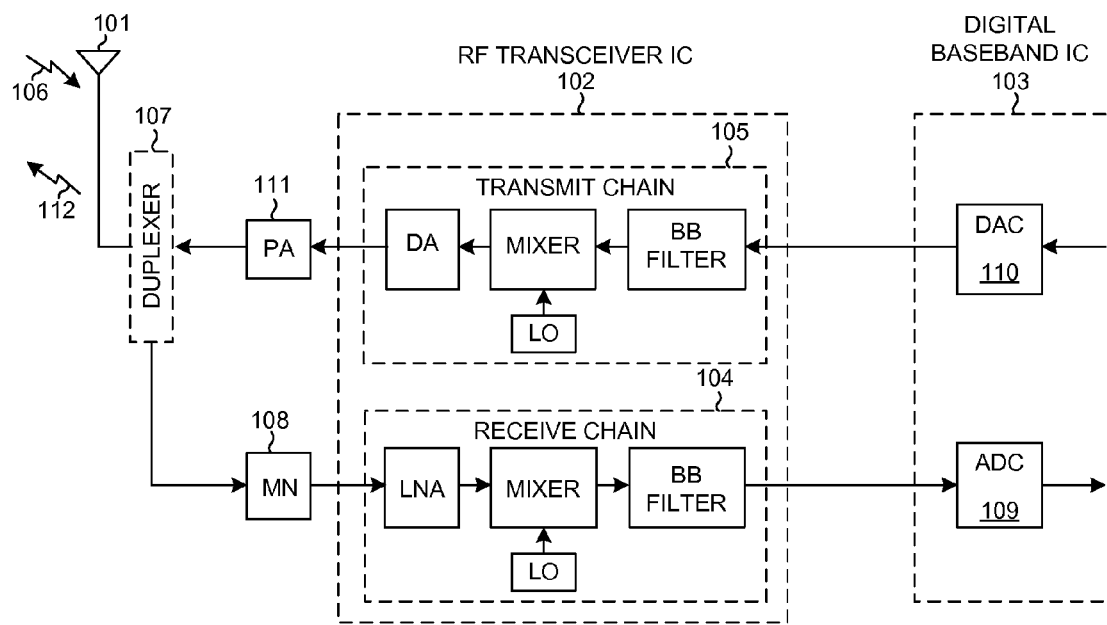
FIG. 3 is a more detailed block diagram of the antenna 101 and the RF transceiver integrated circuit 102 of FIG. 2.

FIG. 3 is a more detailed block diagram of the antenna 101 and the RF transceiver integrated circuit 102 of FIG. 2. The RF transceiver integrated circuit 102 includes a receive chain 104 and a transmit chain 105. An incoming transmission 106 is received on antenna 101, and passes through a duplexer 107 and matching network 108 and into the receive chain 104. After being down-converted in receive chain 104, the received signal passes to an Analog-to-Digital Converter (ADC) 109 in the digital baseband integrated circuit 103 for further processing. If wireless communication device 100 is to make a transmission, then digital information is converted into analog form by a Digital-to-Analog Converter (DAC) 110 in the digital baseband integrated circuit 103. The resulting analog signal is then upconverted by transmit chain 105 of the RF transceiver integrated circuit 102, and the resulting RF signal is amplified by power amplifier PA 111. The amplified signal passes through duplexer 107 and to antenna 101 for transmission as outgoing transmission 112.

Figure 4:
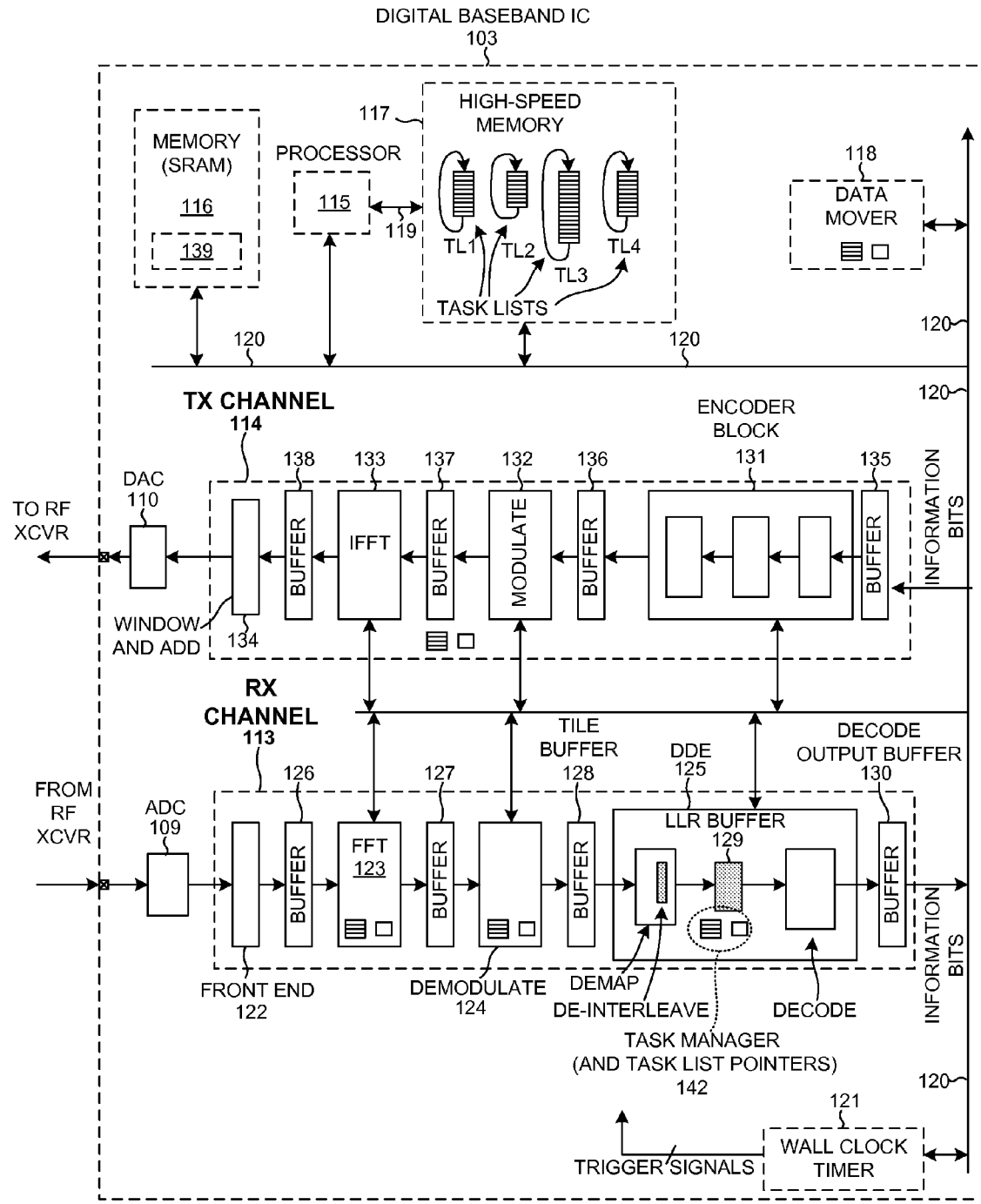
FIG. 4 is a more detailed block diagram of the digital baseband integrated circuit 103 of FIG. 2.

FIG. 4 is a more detailed block diagram of digital baseband integrated circuit 103 of FIG. 2. Digital baseband integrated circuit 103 includes, among other portions not illustrated, ADC 109, a receive channel 113, a transmit channel 114, DAC 110, a processing circuit 115, an amount of memory 116, an amount of high-speed memory 117, a data mover engine 118, a first bus 119, a second bus 120, and a wall clock timer 121. Receive channel 113 in turn includes a set of processing blocks 122-125, referred to here as Wireless Communication System Modem Sub-Circuits (WCSMSCs) organized in a chain to handle a stream of incoming data. These WCSMSCs include a front end WCSMSC 122, a Fast Fourier Transform WCSMSC 123, a Demodulate (DEMOD) WCSMSC 124, and a Demap/De-Interleave/Decode (DDE) WCSMSC 125. DDE WCSMSC 125 in turn includes a demapper portion, and LLR buffer 129, and a decoder portion as explained below in further detail. Data flow passing through the various WCSMSCs of the receive channel 113 is buffered by buffers 126-130. The general path of receive channel data is from left to right in FIG. 4 through circuits 109, 122, 126, 123, 127, 124, 128, 125, 130 to second bus 120. Similarly, transmit channel 114 includes a corresponding set of WCSMSCs 131-134 and buffers 135-138. The general path of transmit channel data is from right to left in FIG. 4 from second bus 120, to 135, 131, 136, 132, 137, 133, 138, 134, and 110.

Processing circuit 115 may include multiple processors. Processing circuit 115 executes a program 139 of processor-executable instructions stored in memory 116. High-speed memory 117, first bus 119 and processing circuit 115 together form a Tightly Coupled Memory (TCM) system. Processing circuit 115 can read from and write to high-speed memory 117 across first bus 119.

In this example, processing circuit 115 controls the various sub-circuits 122-125 and 131-134 of the receive and transmit channels using what are called "task lists". A task list includes one or more task instructions. In the illustration, four task lists TL1, TL2, TL3 and TL4 are shown stored in memory 117. Task list TL1 contains task instructions for the transmit channel 114. Task list TL2 contains task instructions for FFT WCSMSC 123. Task list TL3 contains task instructions for DEMOD WCSMSC 124. Task list TL4 contains task instructions for DDE WCSMSC 125. Each task list contains a sequence of task instructions for execution by an associated sub-circuit. The sub-circuit includes a task manager circuit that is coupled to second bus 120 as well as an amount of dedicated functional circuitry for performing the data processing operation of the circuit. The task manager reads a task instruction from its associated task list, and interprets an opcode and various fields of the task instruction, and then controls the associated hardware of the dedicated functional circuitry to perform an operation as indicated by the task instruction. The task manager for DDE WCSMSC 125 in FIG. 4 is identified by reference numeral 142. By placing appropriate task instructions into the task list for a particular sub-circuit, processing circuit 115 can cause the dedicated functional circuitry of a particular sub-circuit to perform a particular operation specified by the processing circuit. Processing circuit 115 can write task instructions into these task lists, modify these task lists, delete task lists, and otherwise maintain the task lists as desired via first bus 119. Each task list is maintained in memory 117 in a circular buffer.

Figure 5:
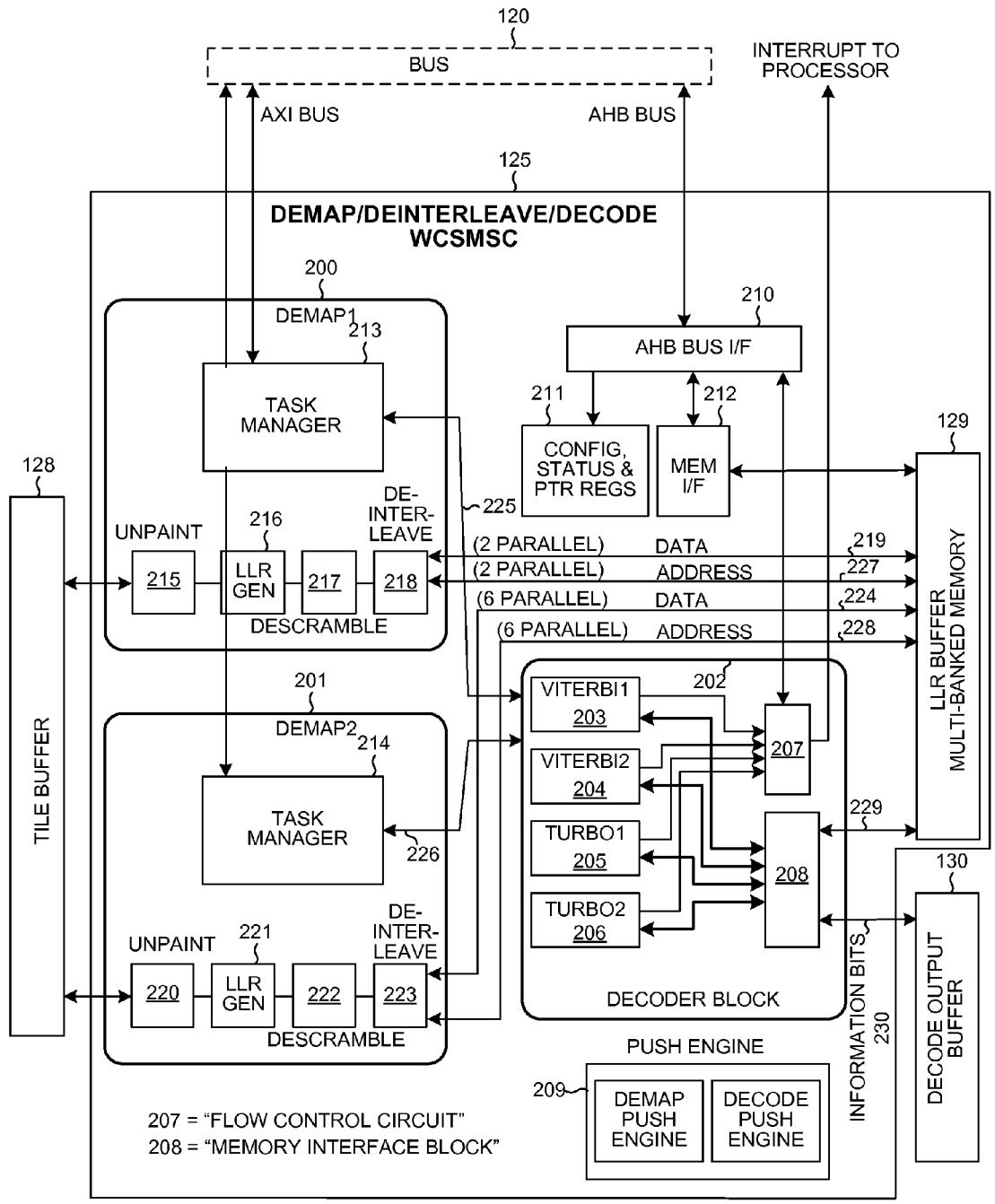
FIG. 5 is a more detailed block diagram of DDE WCSMSC 125 of FIG. 4.

FIG. 5 is a more detailed block diagram of DDE WCSMSC 125 of FIG. 4. The demapper portion of DDE WCSMSC 125 actually includes two DEMAP circuits 200 and 201. The decoder portion 202 of DDE WCSMSC 125 includes two Viterbi decoders 203 and 204, two turbo decoders 205 and 206, a flow control circuit 207, and memory interface circuitry 208. In addition to the DEMAP and decoder portions, DDE WCSMSC 125 includes a push engine 209, a bus interface 210 for interfacing to the second bus 120, a set of configuration, status and pointer registers 211, and a memory interface 212. The task manager 142 of FIG. 4 is distributed into task manager blocks 213 and 214, and into the registers 211. The overall task manager functionality receives task instructions. Some of these task instructions includes fields for controlling DEMAP circuit 200 and those fields are interpreted and used by task manager portion 213, whereas other field are for controlling DEMAP circuit 201 and those fields are interpreted and used by task manager portion 214. Processing circuit 115 of FIG. 4 generally writes a task instruction onto the task list TL4 for DDE WCSMSC 125, and then performs a single write across the second bus 120 and AHB bus interface 210 to update a WR_PTR in register block 211. The task manager portions 213 and 214 detect that the WR_PTR value in the register in block 211 now points to a location in the circular buffer in memory 117 (see FIG. 4) after the last task instruction executed. The task manager portions therefore read the next task instruction of TL4 across the second bus 120, and then interpret and execute the task instruction. The task manager portions of DDE WCSMSC 125 maintain an EXEC_PTR in another register in register block 211. The value of this EXEC_PTR indicates the last task instruction in task list TL4 that has been executed.

DEMAP1 portion 200 of FIG. 5 is a relatively low throughput circuit used for control packets, whereas DEMAP2 portion 201 is a relatively high throughput circuit used for data packets. DEMAP1 portion 200 includes the following functional blocks: unpaint block 215, a Log-Likelihood Ratio (LLR) generator block 216, a descrambler block 217, and a de-interleaver block 218. DEMAP1 portion 200 interfaces to the LLR buffer 129 via conductors 219 and 227. LLR buffer 129 is a multi-segment, multi-banked memory as described in more detail below. Data conductors 219 provide two parallel read/write channels for data. Address conductors 227 provide the address information for writing data from de-interleave circuit 218 into LLR buffer 129, and for reading data from LLR buffer 129 back into de-interleave circuit 218. Higher throughput DEMAP2 portion 201 includes the following functional blocks: an unpaint block 220, a Log-Likelihood Ratio (LLR) generator block 221, a descrambler block 222, and a de-interleaver block 223. DEMAP2 portion 201 interfaces to LLR buffer 129 via conductors 224 that provide six parallel read/write data channels to the LLR buffer. Address information for the six parallel read/write channels is provided to LLR buffer 129 via address conductors 228.

Once a DEMAP/de-interleave/decode operation has begun, processing always proceeds through each successive step from the unpaint step, to LLR generation, to descrambling, to de-interleaving and to decoding. Separate task instructions are therefore not necessary to control the DEMAP, de-interleave and decode aspects of processing. Rather, a single task instruction is used to control the entire sequence of processing through these steps. Once a DEMAP portion 200 or 201 has completed its portion of processing on a sub-packet, then the sub-packet is forwarded by the DEMAP portion to the decoder block along with status information associated with the sub-packet. Decoder block 202 then processes the received sub-packet as soon as possible. The DEMAP portions 200 and 201 forward a sub-packet to decoder block 202 by first writing the sub-packet into a portion of LLR buffer 129, and then informing decoder block 202 via conductors 225 and 226 of the location of the sub-packet in LLR buffer 129, of where the decoder block 202 should write the result of decoding into decode output buffer 130, and of status information associated with the sub-packet.

Figure 6:
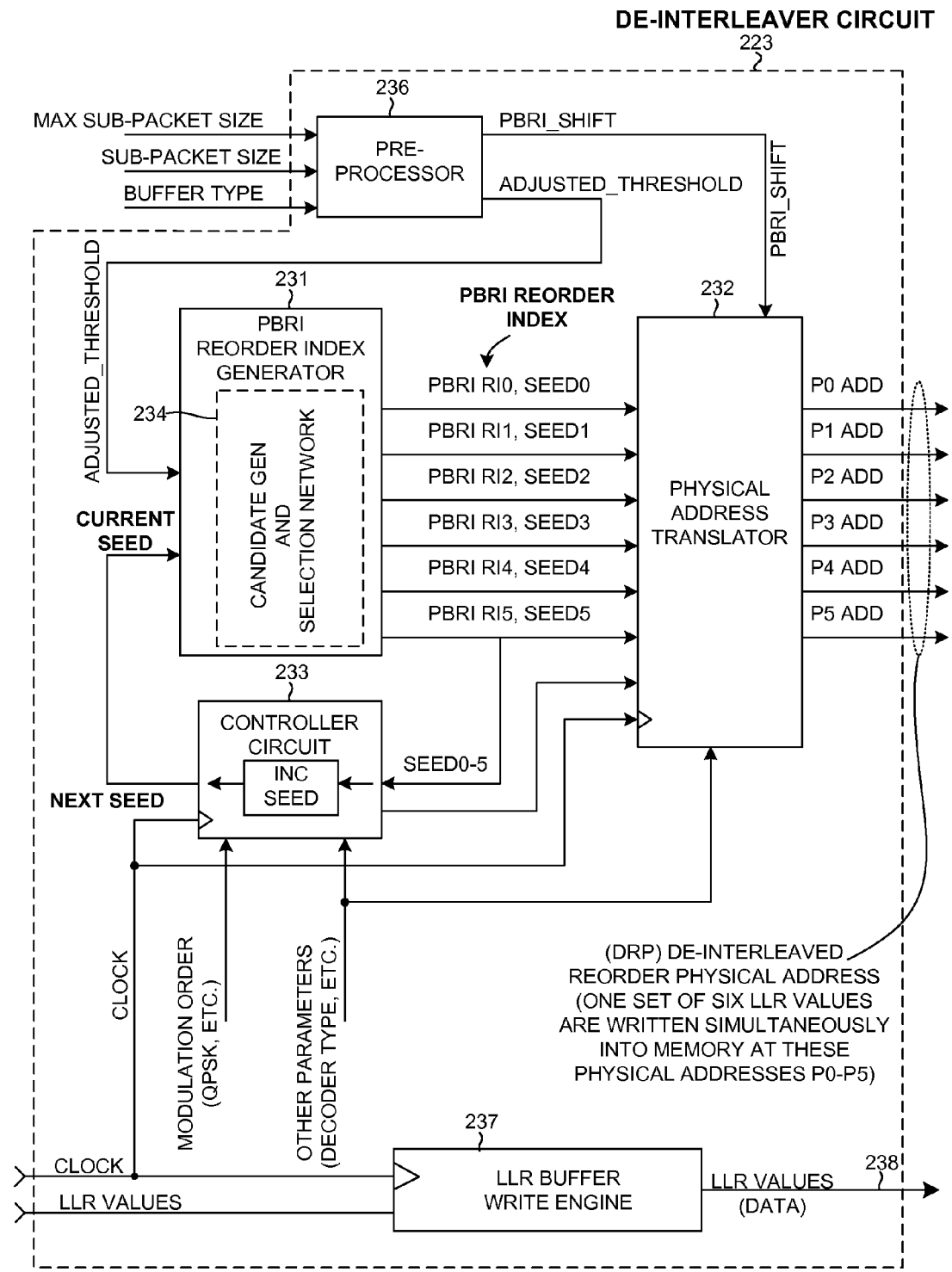
FIG. 6 is a more detailed block diagram of a de-interleaver circuit of FIG. 5.

FIG. 6 is a more detailed block diagram of de-interleaver circuit 223. De-interleaver circuit 223 includes a Pruned Bit Reversal Interleaved (PBRI) reorder index generator 231, a physical address translator 232, a controller circuit 233, a pre-processor circuit 236, and a LLR buffer write engine 237. PBRI reorder index generator 231 includes an amount of non-sequential logic and generates twelve candidate PBRI reorder indices from a current seed value. With each candidate PBRI reorder index, the PBRI reorder index generator 231 also indicates whether the associated candidate PBRI reorder index is out of range. Next, in response to a CLOCK signal, physical address translator 232 converts the six PBRI reorder indices into six corresponding de-interleaved reorder physical addresses P0-P5. The PBRI reorder indices coming into the physical address translator 232 are registered within translator 232. Controller circuit 233 then obtains a "current seed" for the next PBRI reorder index generation cycle. Candidate generator and selection circuit 234 then generates another set of six PBRI reorder indices. The physical addresses P0-P5 are six de-interleaved reorder physical addresses (DRP addresses) used to store six corresponding LLR values that are supplied via conductors 238 into LLR buffer 129.

As indicated in FIG. 6, during the time that PBRI reorder index generator 231 is generating a next set of six PBRI reorder indices, the physical address translator 232 is generating a set of six de-interleaved reorder physical addresses for the previously generated set of six PBRI reorder indices. Not only are the PBRI reorder index generation and physical address generation operations pipelined, but also the writing of LLR values into an LLR buffer 129 of FIG. 5 is also pipelined. A previously received set of LLR values is written into the LLR buffer 129 at the same time that physical address translator 232 is generating a set of physical addresses for a later-received set of LLR values, and at the same time that PBRI reorder index generator 231 is generating PBRI reorder indices for a still later-received set of LLR values. LLR buffer write engine 237 receives the LLR values when a CLOCK edge is received and sends the LLR values to the multi-banked LLR buffer 129 of FIG. 5 via conductors 238 to be written into LLR buffer 129 at addresses (the de-interleaved reorder physical addresses).

Figure 7:
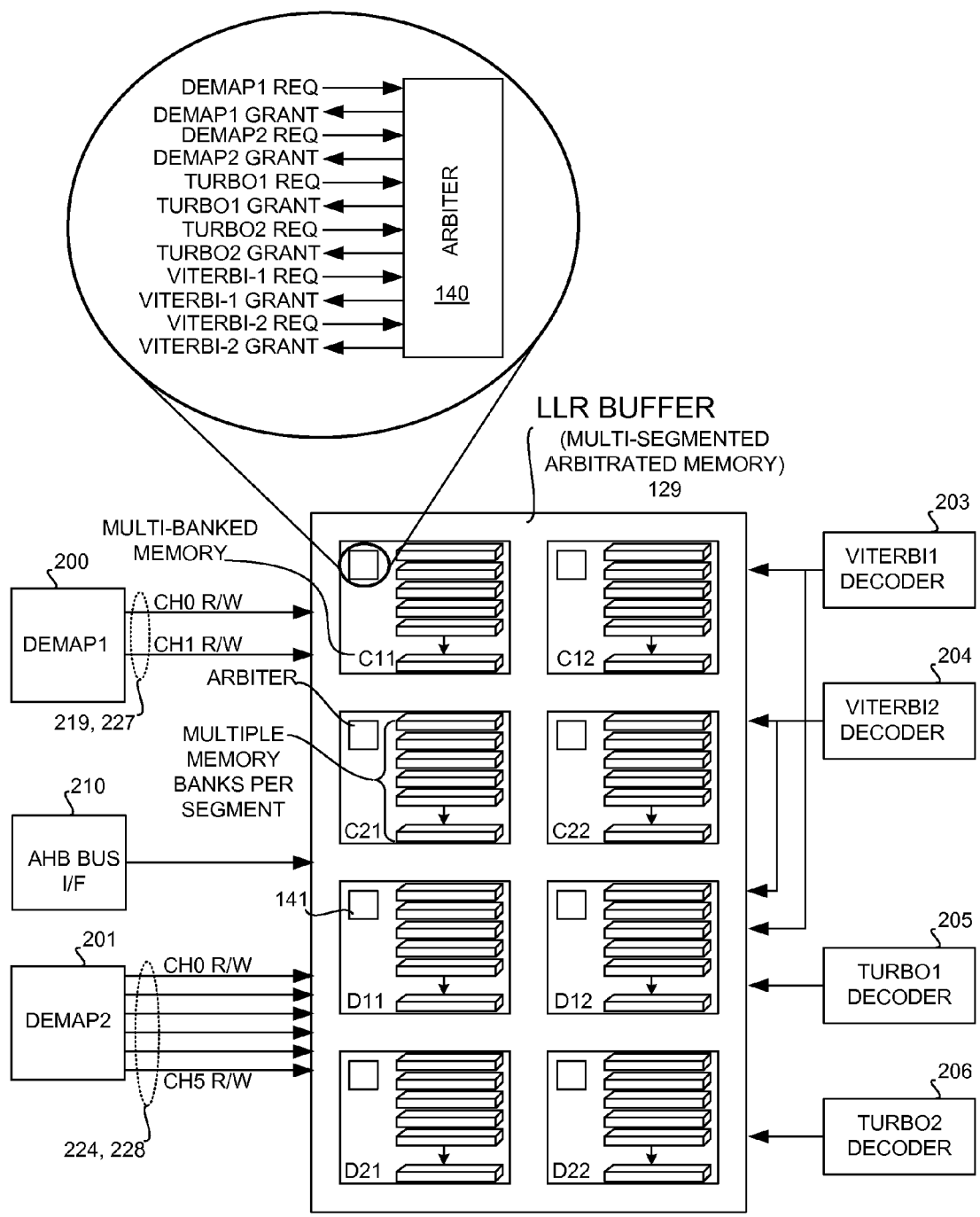
FIG. 7 is block diagram of the LLR buffer of FIG. 5.

FIG. 7 is a more detailed diagram of the LLR buffer 129 of FIG. 5. LLR buffer 129 is a multi-segmented arbitrated memory with multi-banked memory segments C11, C12, C21, C22, D11, D12, D21, and D22. Each memory segment contains a plurality of memory banks and an arbiter 140. Arbiter 140 is shown in a magnified section of FIG. 7. Included in FIG. 7 are the demap and decode circuits of FIG. 5: DEMAP1 200 and DEMAP2 201, VITERBI1 203, VITERBI2 204, TURBO1 205, and TURBO2 206. The LLR buffer is also accessible from AHB interface 210. Memory segments C11, C12, C21 and C22 may store control channel packets and are accessed by the DEMAP1 circuit 200, both VITERBI decoders 203 and 204, and the AHB bus interface 210. The DEMAP1 circuit 201 and the AHB bus interface 210 have write and read control over the control channel memory sections and the decoders have read access from the control channel memory sections. The D11, D12, D21, and D22 multi-banked memory sections are used to store data channel sub-packets and access is possible by the DEMAP2 circuit 201, the AHB interface, both VITERBI decoders 203 and 204 and both TURBO decoders 205 and 206. Write and read access is permitted by the DEMAP2 201 and the AHB interface 210 and the decoders have read access to the data section of the LLR buffer 129. DEMAP2 201 interfaces with memory segments D11, D12, D21, and D22 through six parallel sets of address and data conductors 224 and 228 as shown in FIG. 7.

Access to each multi-banked memory segment is arbitrated by the arbiter of the segment. For example, arbiter 140 is the arbiter for segment C11. In one embodiment, the arbiter has two programmable modes and each segment can operate in either mode independent of the arbitration mode of any other segment. In the first mode, the arbiter ensures that the first grant goes to a demap circuit. The second grant is then given to either a VITERBI or a TURBO decoder circuit. This pattern then repeats with the third grant going to a demap circuit. This ensures that the demap circuits have access to the multi-banked memory segment followed by an access grant to a decoder. In this first programmable mode, DEMAP2 201 has priority over DEMAP1 200 when the arbiter of a segment grants a request to a DEMAP circuit. When the arbiter grants a request to a decode circuit, the priority of decoders in descending order is: TURBO2 206, TURBO1 205, VITERBI2 204, and VITERBI1 203. In the second mode, the arbiter grants access to requests based on the priority of the requesting circuit. The order of priority in this mode in descending order of priority is: TURBO2 206, TURBO1 205, VITERBI2 204, VITERBI1 203, DEMAP2 201 and DEMAP1 200. Once the arbiter grants access to a demap or decoder circuit, only that circuit has access to that memory segment until processing is complete and that memory section is released by the arbiter. For example, the arbiter 141 may receive an access request from DEMAP2 201 to write into multi-banked memory segment D11. Arbiter 141 grants the request and DEMAP2 responds by simultaneously sending six De-interleaved Reorder Physical (DRP) addresses to multi-banked memory segment D11 through six parallel address channels such that six simultaneous LLR values from DEMAP2 201 are written into multi-banked memory segment D11. This process may be repeated until all LLR values of a sub-packet are written into memory segment D11. The turbo-decoders 205 and 206 may then request access to memory segment D11 and access is granted by arbiter 141. In the next step, a TURBO decoder reads the LLR values from segment D11 in de-interleaved form.

Figure 8:
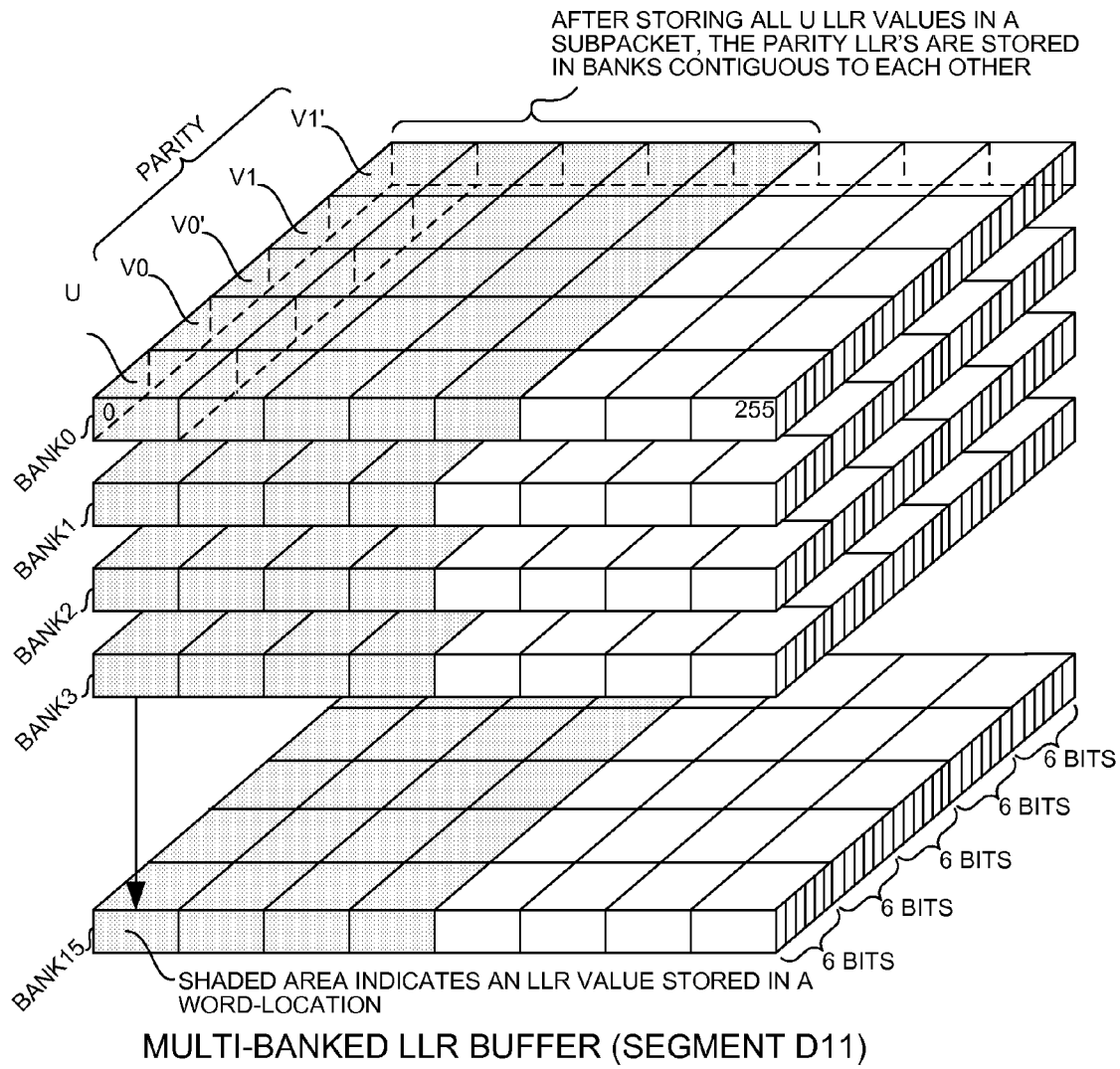
FIG. 8 is a block diagram of a multi-banked memory segment D11 of the LLR buffer of FIG. 7.

FIG. 8 is a detailed drawing of multi-banked memory segment D11 of the LLR buffer 129. The segment includes sixteen banks of memory, BANK0 through BANK16. In the present simplified illustration, each bank is 256 word-locations deep. The least significant word-location is shown in the left-most position 0, whereas the most significant word-location is shown in the right-most position 255. Although this example involves a depth of 256, in an actual implementation the depth is substantially greater. The depth can be, for example, deep enough to accommodate forty or eighty sub-packets, depending on the number of interlaces in a communication standard being supported.

In the illustrated example, each one of the word-locations of FIG. 8 is at least thirty bits wide and may hold up to five LLR values each, with each LLR value being six bits in length. In this configuration, all of the "U" LLR values of a sub-packet are stored in banks contiguous to each other with the "U" LLR values occupying the least significant bits of each word-location. Although this example involves a width of five LLR values, in an actual implementation the width is adequate to store eight LLR values.

FIG. 8 also shows which word-locations of the sixteen banks would contain LLR values in an example of a sub-packet of length of sixty-five LLR values. The shaded region of each bank indicates those word-locations that contain LLR values, if all the LLR values of the sub-packet are stored in the segment. In bank0, the first five memory address locations contain data. In all remaining banks, bank1 through bank15, the first four address locations contain LLR values. Non-shaded regions store zero values. For a sub-packet length of 4096 LLR values, all the word-locations of all sixteen banks would contain LLR values.

Figures 9, 10, 11:
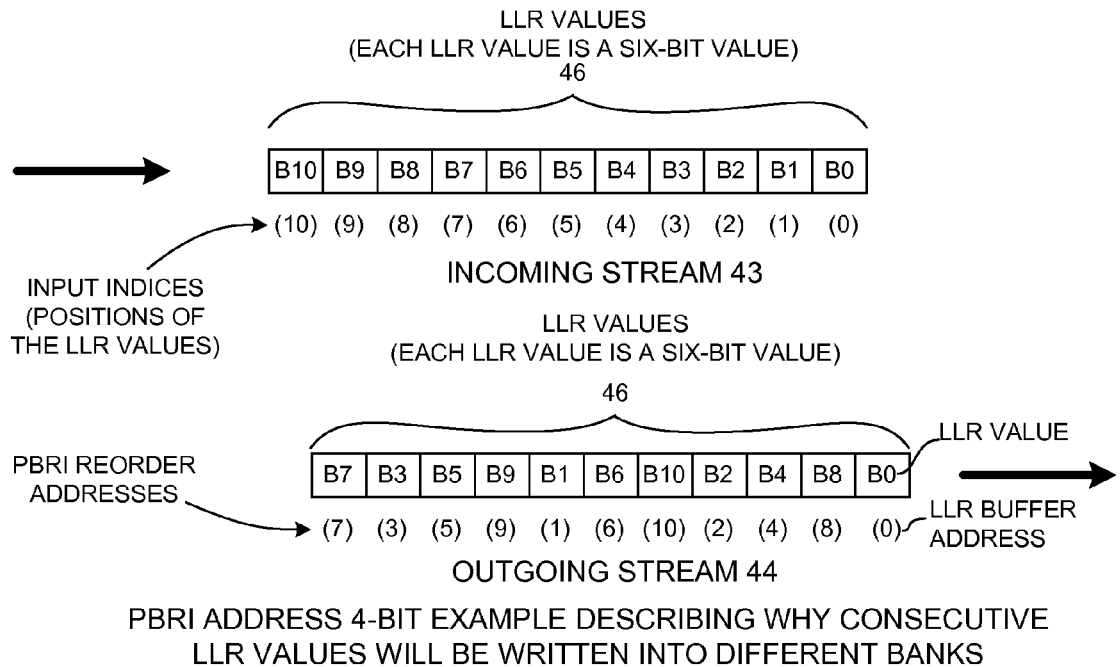
FIG. 9 is a diagram that illustrates an example of an incoming stream of interleaved LLR values that passes into the de-interleaver circuit 223 of FIG. 5.
FIGS. 10 and 11 are diagrams that illustrate how PBRI reorder indices are determined for the example of the incoming sequence of LLR values of FIG. 9.

FIGS. 9-11 are diagrams that describe how consecutive LLR values can be written into a segment without collisions. FIG. 9 illustrates an example of outgoing stream 44 of LLR values of sub-packet 46 after de-interleaving. As indicated by the indices in parentheses, the positions of the LLR values B0-B11 are de-interleaved (deshuffled). The indices defining the reordered and de-interleaved LLR value positions are referred to here as "PBRI reorder indices". To de-interleave a sub-packet of LLR values, the indices for the various LLR values in the de-interleaved packet are determined. For each successive PBRI reorder index in the sequence of PBRI reorder indices, the associated LLR value is output to form the de-interleaved stream 44.

FIGS. 10 and 11 are diagrams that illustrate one way that the PBRI reorder indices may be determined for the example of FIG. 9. In the simplified example of FIG. 9, the sub-packet has a size of eleven. The minimum number of binary bits that can represent eleven values is four. The sixteen possible four-bit binary values are therefore set forth in the left most column 47 of FIG. 10. For each four-bit value, its corresponding decimal representation is set forth in parentheses in the next left-most column 48. Four-bit binary value "0000" for example is represented by decimal value (0). The PBRI method involves a "bit reversal" operation. The bit reversed version of each four-bit value in column 47 is therefore recorded in column 49. Four-bit binary value "0111" in column 47 for example is bit reversed to be four-bit binary value "1110" in column 49. The rightmost column 50 sets forth the decimal equivalents of the values in column 49. The relationship between columns 48 and 49 defines a reordering, but there are more indices in these columns than there are LLR values in packet 46. The size of sub-packet 46 is eleven, and there are sixteen values in columns 48 and 50. The number of reorder indices is therefore "pruned" down to eleven. As indicated in FIG. 11, values in the rightmost column that are greater than ten are said to be "out of range" and are indicated in FIG. 11 with darkened backgrounds. The de-interleave circuit 223 will then write the associated LLR values into multi-banked LLR buffer 129 at these addresses.

The four-bit binary value in column 49 selects one of sixteen available banks of each multi-banked LLR buffer segment of LLR buffer 129 of FIG. 7. The demap circuit will then select six successive ones of these PBRI reorder physical addresses to simultaneously write the associated six LLR values into the segment. The addresses are sent to LLR buffer 129 using the six sets of parallel address conductors 228 of FIG. 5. The six LLR values corresponding to each set of six PRBI reorder physical addresses are made available for writing to LLR buffer 129 via six sets of parallel data conductors 224 of FIG. 5. Each one of these physical reorder addresses corresponds to a different bank within multi-banked memory segment within LLR buffer 129. Accordingly, not more than one LLR value is written into each bank of the multi-banked memory at a time.

Figure 12:
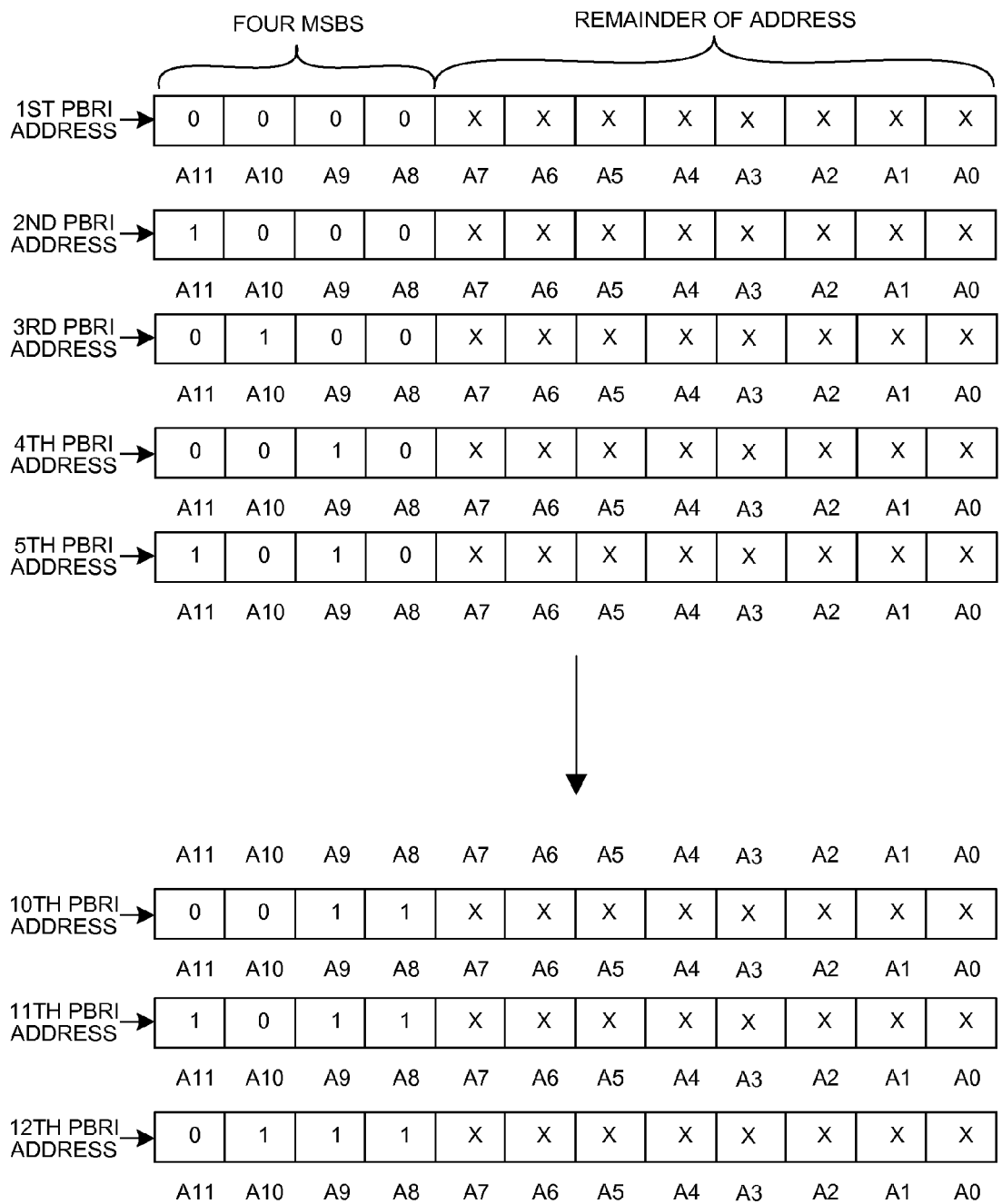
FIG. 12 is a diagram showing PRBI addresses. The four most significant bits (MSBs) of each address is shown for all possible PRBI addresses that may be generated simultaneously by the de-interleaver circuit 223 of FIG. 6.

FIG. 12 is a more detailed example showing twelve-bit PBRI addresses, each address corresponding to a six-bit LLR value. The four most significant bits (MSBs) of each address are located on the left and have been selected by the process diagramed in FIGS. 9-11. The remainder of the address is located to the right of the MSBs. The four MSBs selects the bank of a segment in which the corresponding LLR value will be stored. For instance the four MSBs of a first PBRI address "0000" may select "BANK0" of multi-banked LLR buffer segment D11. Each remaining set of four MSBs will correspond to a different bank of memory within that same segment, thereby ensuring that no more than one LLR value is written into each bank of multi-banked memory at a time.

Figure 13:
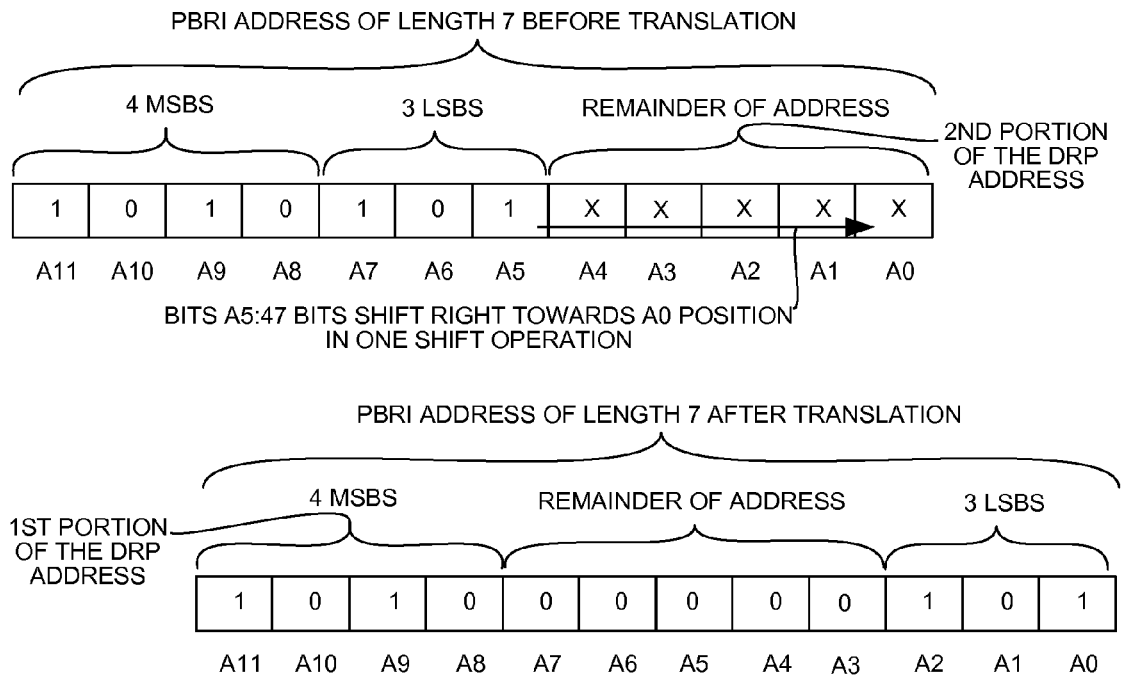
FIG. 13 is a diagram showing PRBI addresses before and after they have been shifted (address translated) to accommodate a PRBI address seven bits in length.

FIG. 13 is a diagram showing bit shifting of a PBRI physical address that is seven bits in length and within a twelve-bit address field. Before translation, all bits of the address in FIG. 13 are in the left-most locations of a twelve-bit address field.

The four MSBs determine the bank location and three least significant bits (LSBs), "101," determine the word-location within the bank selected by the MSBs. The physical address translator 232 of FIG. 6 performs a simultaneous shift and positions the three LSBs of the address in the right-most locations of the address field. The MSBs, "1010," remain in the left-most locations and in one embodiment all remaining bits are set to the binary value "0" This bit shifting operation ensures bits will be written to intended address locations when the twelve-bit address location is not completely occupied.

Figure 14:
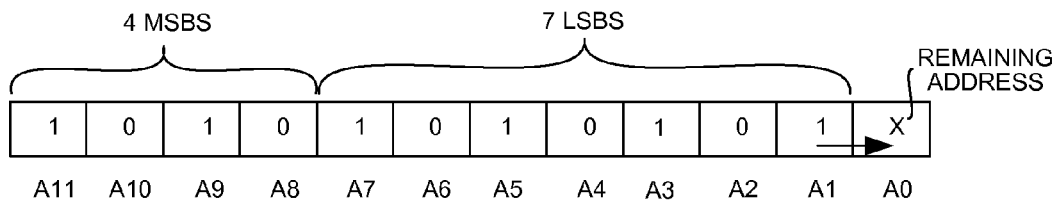
FIG. 14 is a diagram showing PRBI addresses before and after they have been shifted (address translated) to accommodate a PRBI address eleven bits in length.
Figure 14:
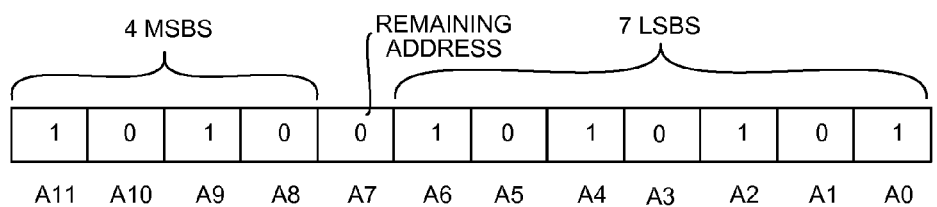

FIG. 14 is another diagram showing the shifting of a PBRI physical address that is less than twelve bits in length. In FIG. 14, the PBRI physical address is eleven bits in length. Before translation, all bits of the address in FIG. 14 are in the left-most locations of a twelve-bit address field. The four MSBs determine the bank location. The eight LSBs, "10101010," determine the address location within the bank selected by the MSBs. In this example, the physical address translator 232 of FIG. 6 performs a simultaneous shift and positions the eight LSBs of the address in the right-most locations of the address field. The MSBs, "1010," remain in the left-most locations and in one embodiment the remaining bit is set to the binary value "0."

Figure 15:
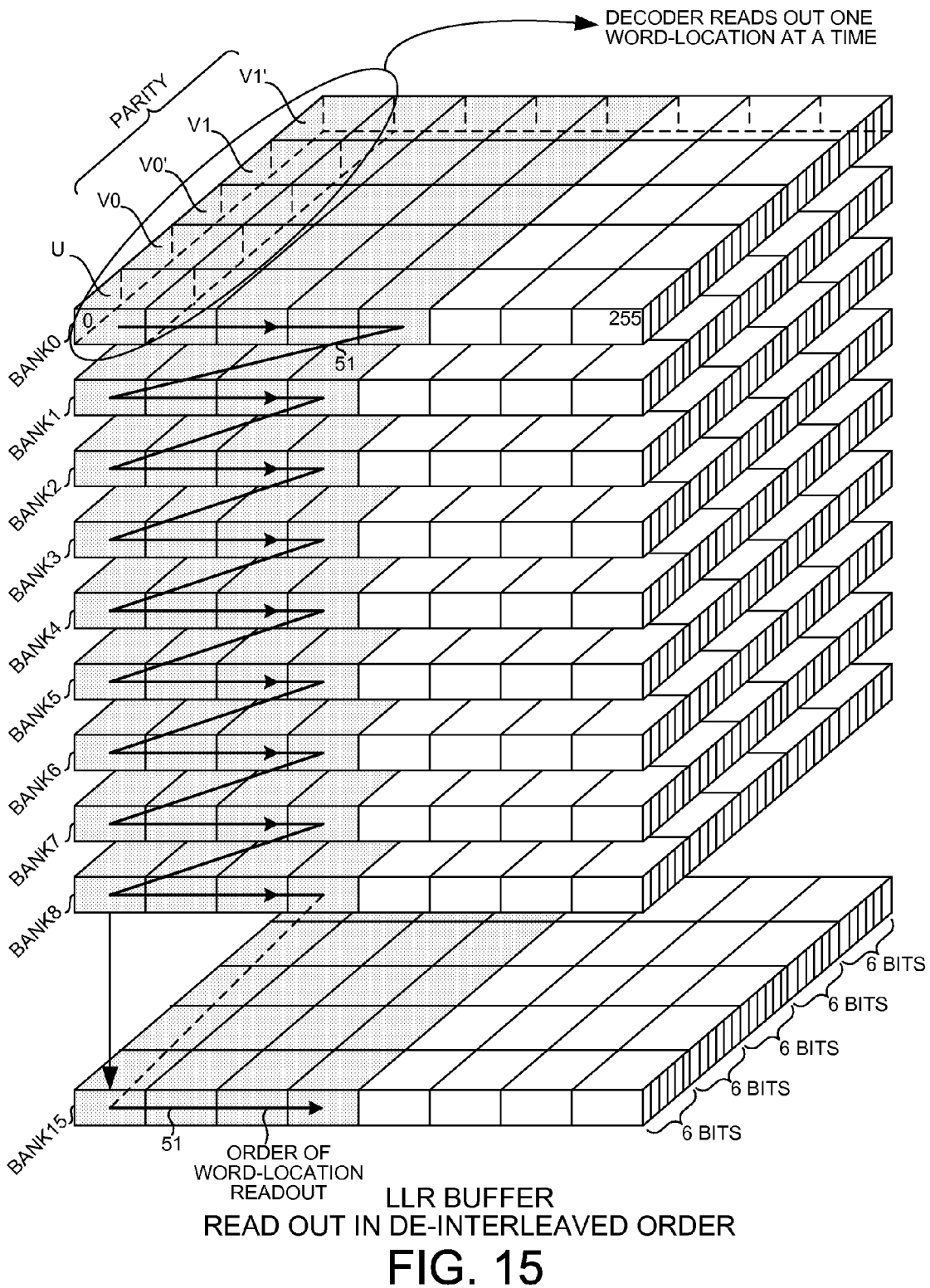
FIG. 15 is a diagram showing LLR values and parity LLR values can be contiguously positioned in a word-location of a bank of the LLR buffer, and how the LLR values can be read of the LLR buffer in a de-interleaved order.

FIG. 15 is a perspective diagram showing LLR values being read out of a segment of LLR buffer 129 one word-location at a time and in de-interleaved order. The LLR buffer segment includes sixteen banks of memory, BANK0-BANK15, each bank having 256 addressable word-locations. In the illustrated example, each of the 256 addressable word-locations contains enough bits that it can store five LLR values: one "U" six-bit LLR value, and four additional parity LLR values that are each six bits in length. The four additional LLR values include parity information for detecting and repairing errors in the first "U" six-bit LLR value. LLR value "U" is shown in FIG. 15 with corresponding parity LLR values: V0, V0', V1, and V1'.

FIG. 15 further shows how all the contents of the word-location is read out simultaneously. Because the LLR values with parity and the LLR values without parity may be stored contiguous to one another and within one word location, a decoder may subsequently and simultaneously read out non-parity LLR values along with parity LLR values. The decoder reads out the LLR values in de-interleaved order as indicated by arrow 51. In the example of FIG. 15, the decoder reads the upper-leftmost word-location in BANK0, then the next word-location to the right in BANK0, and so forth until all shaded word-locations in BANK0 are read. Then the decoder reads the leftmost word location in BANK1, and then the next word-location to the right in BANK1, and so forth until all shaded word-locations in BANK1 are read. This reading proceeds, vertically down from bank to bank until the decoder has read all shaded word-locations. This reading, which results in de-interleaving of the read LLR values, is possible due to the novel address translation described above in connection with FIG. 13 and FIG. 14. Storage locations that do not contain LLR values, contain zero values. In a first transmission, only some of the LLR values of a sub-packet may be received and written into the LLR buffer. Some word-locations that are pictured as shaded in FIG. 15 for the sub-packet size may, for example, contain all zeros after the first transmission. Similarly, some of the LLR positions within a given word-location may contain zeros, whereas other LLR positions in the word-location are filled with LLR values. Regardless of how many LLR values are received in the first transmission, the decoder may read all the shaded word-locations in the de-interleaved order indicated by arrow 51, and attempt to decode the sub-packet. If the decoding fails, then more LLR values of the sub-packet may be received in a second transmission. At the end of the second transmission, the decoder may again read all the shaded word-locations in the de-interleaved order and attempt to decode the sub-packet. This process continues a number of times or until there has been a successful decoding of the sub-packet.

Figure 16:
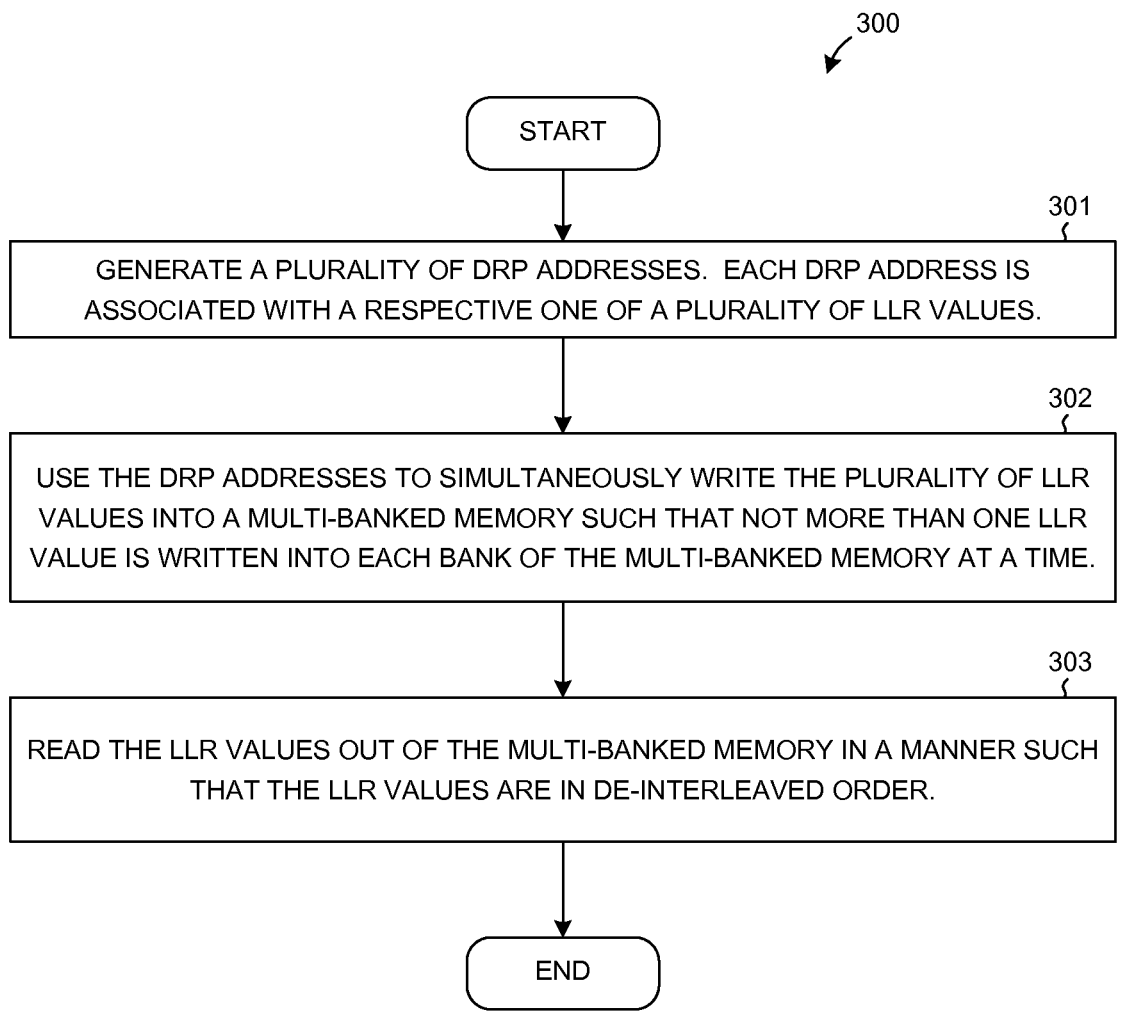
FIG. 16 is a flowchart of a method that involves simultaneously writing multiple LLR values into a multi-banked memory.

FIG. 16 is a flowchart of a novel method 300. In a first step 301, an amount of non-sequential logic simultaneously generates a plurality of de-interleaved reorder physical (DRP) addresses. Each of the DRP addresses identifies a different bank of a multi-banked memory. Each of the DRP addresses also corresponds to an LLR value of an incoming interleaved stream of LLR values.

In a second step 302, a plurality of the LLR values is simultaneously written into the multi-banked memory without collisions such that not more than one LLR value is written into each bank the multi-banked memory at a time. Each of the LLR values is written into the multi-banked memory at a location indicated by its corresponding DRP address.

In a third step 303, a decoder reads the contents of the multi-banked memory in a manner such that the LLR values are read out in a de-interleaved order.

Figure 17:
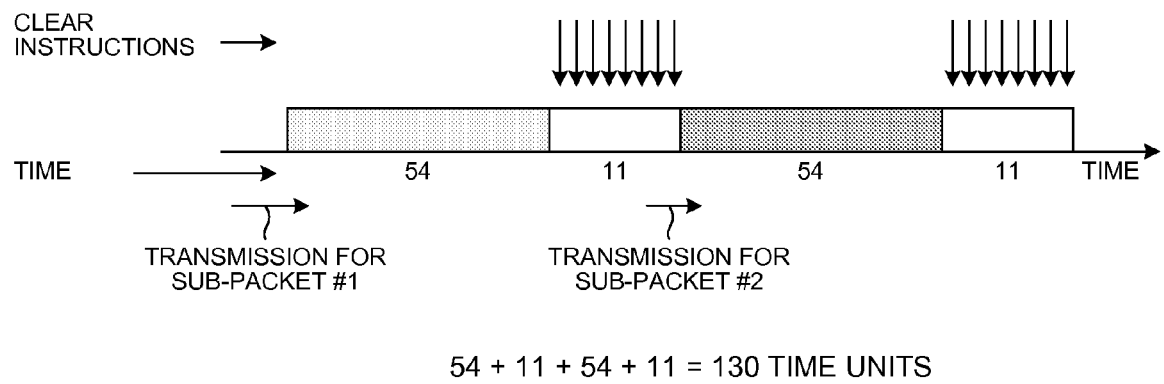
FIG. 17 (Prior Art) is a timeline that illustrates the writing of LLR values of two sub-packets into an LLR buffer.

FIG. 17 (Prior Art) is a timeline that illustrates the writing of LLR values of two sub-packets into an LLR buffer. Each sub-packet has a size of sixty-five LLR values. In this simplified example, there are no LLR parity values. LLR values of a sub-packet are to be written into sixty-five locations. In the example of FIG. 17, although the sub-packet size is sixty-five, the first transmission only includes fifty-four LLR values and only fifty-four LLR values are written into the sixty-five locations assigned to the first sub-packet. Each of these writes takes one unit of time. In the diagram, the "54" indicates that it takes fifty-four time units to write the fifty-four LLR values into fifty-four of the sixty-five locations. After these writes, zero values are written into the remaining eleven of the sixty-five locations. These writes of zero values occur one by one in this example, and the "11" indicates this process takes eleven time units. Each of these zero writes is initiated by a clear instruction. The downward pointing arrows indicate these clear instructions. A decoder then reads the sixty-five locations and attempts to decode the sub-packet. In the illustrated example, there is a second transmission containing LLR values of a second sub-packet. These LLR values are written into another sixty-five locations in the LLR buffer assigned to the second sub-packet. As in the case of the first transmission, the second transmission only includes fifty-four LLR values, so the remaining eleven locations of the portion of the LLR buffer assigned to the second sub-packet are written with zero values. The total number of time units required is 130 time units.

Figure 18:
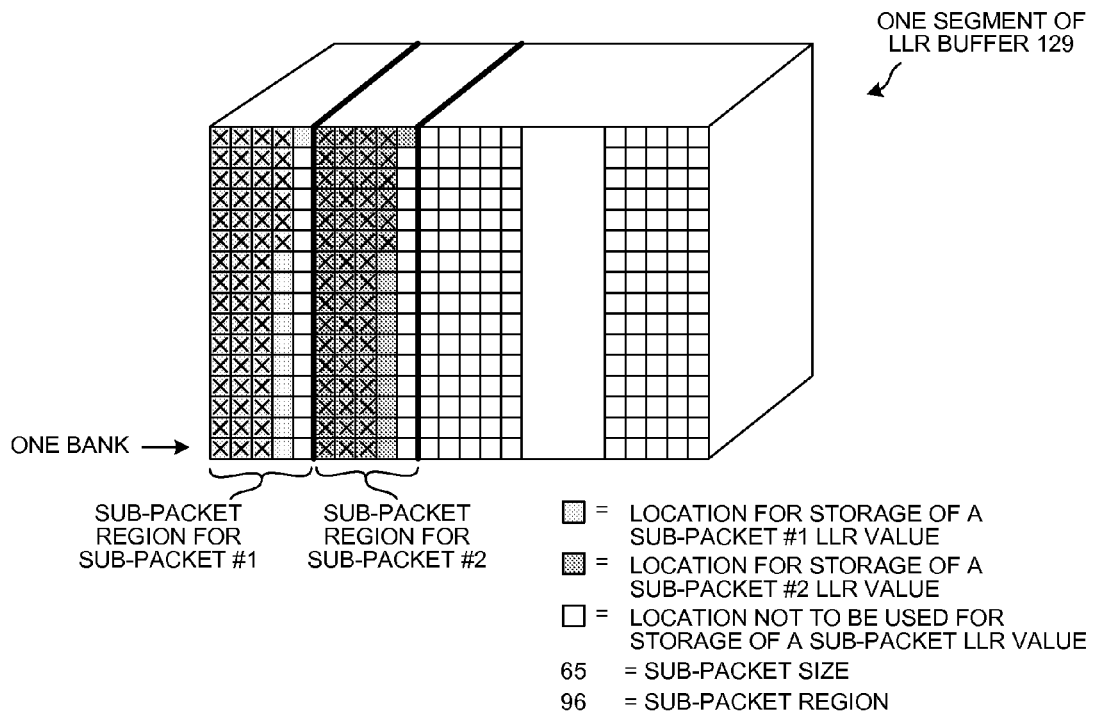
FIG. 18 is a diagram in accordance with a second novel aspect. The diagram shows a segment (a multi-banked memory) having a two sub-packet regions.

FIG. 18 is a perspective diagram of a segment of LLR buffer 129. The segment is a multi-banked memory including sixteen banks. Each bank is one row of word-locations. In an example to be described here, LLR values for two sub-packets are to be written into the segment. The sub-packet size of each of these two sub-packets is sixty-five. LLR values for the first sub-packet are to be written into the word-locations marked with light shading, whereas LLR values for the second sub-packet are to be written into the word-locations marked with darker shading. In a given transmission, some but not all of the LLR values for a sub-packet may be received, but those that are received are written into appropriate word-locations. After a transmission is received, a decoder reads all the word-locations for the sub-packet and attempts to decode the sub-packet.

Figure 19:
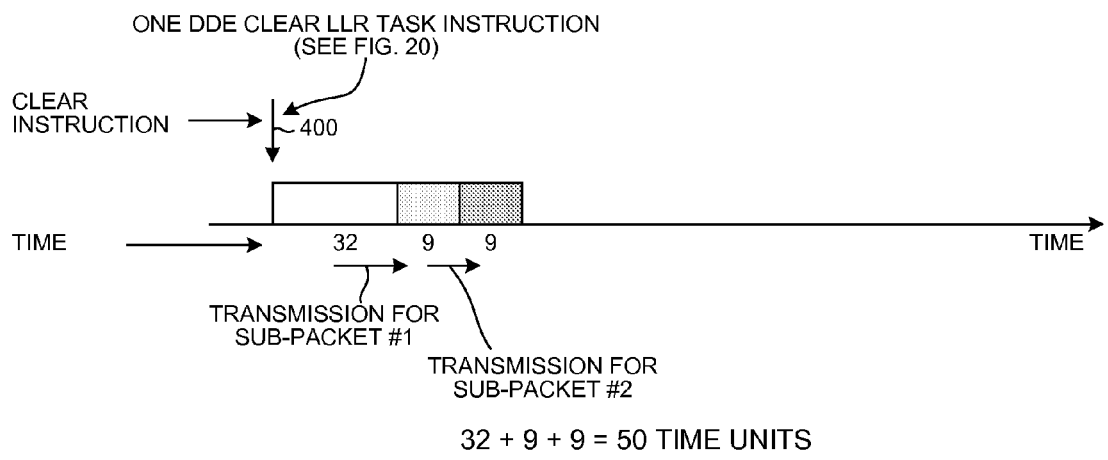
FIG. 19 is a timeline that illustrates a method of writing of LLR values of two sub-packets into the segment of FIG. 18 in accordance with the second novel aspect.

FIG. 19 is a timeline that illustrates the writing of LLR values of the two sub-packets into the segment of FIG. 18 in accordance with a second novel aspect. In this simplified example, there are no LLR parity values. Initially, processing circuit 115 issues a DDE clear LLR task instruction to DDE WCSMSC 125. This is indicated by arrow 400 in FIG. 19. The task manager of a demap circuit within DDE WCSMSC 125 reads the task instruction from the tightly-coupled memory and interprets the task instruction.

Figure 20:
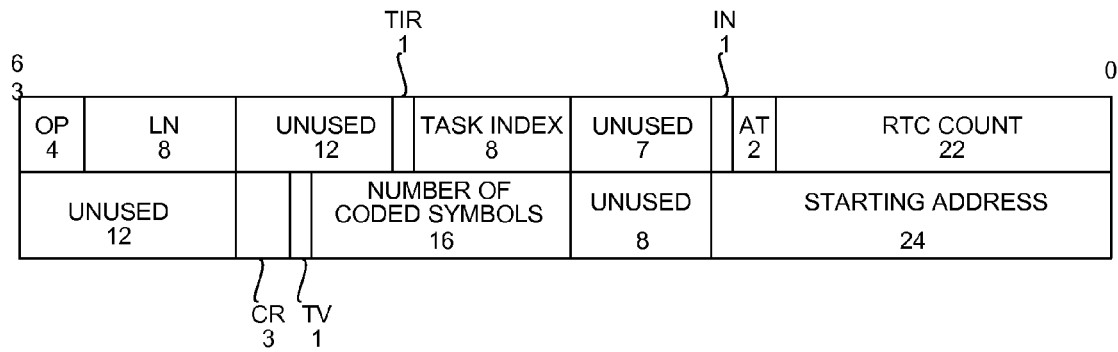
FIG. 20 is a diagram of the DDE clear LLR task instruction used in the method of FIG. 19.

FIG. 20 is a diagram of the DDE clear LLR task instruction. Fields in the task instruction identify a rectangular block of word-locations in the segment. This block includes all word-locations to be used to store LLR values for the first sub-packet and all word-locations to be used to store LLR values for the second sub-packet. In the example described here, the segment is divided into sub-packet regions as illustrated in FIG. 18. A sub-packet region, as illustrated, is a rectangular block of word-locations that includes all the word-locations to be used to store LLR values of the corresponding sub-packet. A sub-packet region spans all the banks of the segment, and includes the same number of word-locations in each bank.

The task manager then causes the demapper to write zero values into all the word-locations indicated by the DDE clear LLR task instruction in a sequence of six simultaneous LLR writes. In the example of FIG. 19, the two sub-packet regions contain a total of 192 word-locations. Thirty-two parallel writes are therefore performed to clear these 192 word-locations. The "32" in the timeline indicates that thirty-two time units are required to carry out these writes. After the block clear operation is completed, then LLR values for the first sub-packet are written into the sub-packet region for the first sub-packet as described above in connection with FIG. 8. In this example, a first transmission only includes fifty-four LLR values of the first sub-packet. Because these LLR values are written six at a time, nine time units are required. Eleven of the word-locations assigned to the first sub-packet are not written with LLR values, but these word-locations already store zero values due to execution of the DDE clear LLR task instruction. Next, a second transmission occurs and fifty-four LLR values for the second sub-packet are received and are written into the sub-packet region for the second sub-packet. These LLR values are written six LLR values at a time, so another nine time units are required to perform these writes. The total number of time units required to store the LLR values of the first and second sub-packets and to ensure that the other word-locations that will be read by the decoder contain zero values is fifty time units. The prior art example of FIG. 17, on the other hand, requires 130 time units to accomplish the same number of LLR write and zeroing operations.

In one novel aspect, processing circuit 115 that controls the LLR write operations must issue only one clear instruction (the DDE clear LLR task instruction) to perform LLR zeroing for multiple sub-packets, whereas in the prior art example many clear instructions are involved. Having to generate these many clear instructions may burden a central processor or other mechanism tasked with controlling the LLR write and zeroing operations. In another novel aspect, multiple LLR values are cleared simultaneously. For example, LLR values stored in six different banks are cleared simultaneously using the parallel write functionality described above in connection with FIG. 8. In yet another novel aspect, all the LLR values stored in a word-location are cleared simultaneously. In the example of FIG. 18 and FIG. 8, each word-location includes bits for storing five LLR values, and all these bits are simultaneously cleared.

Figure 21:
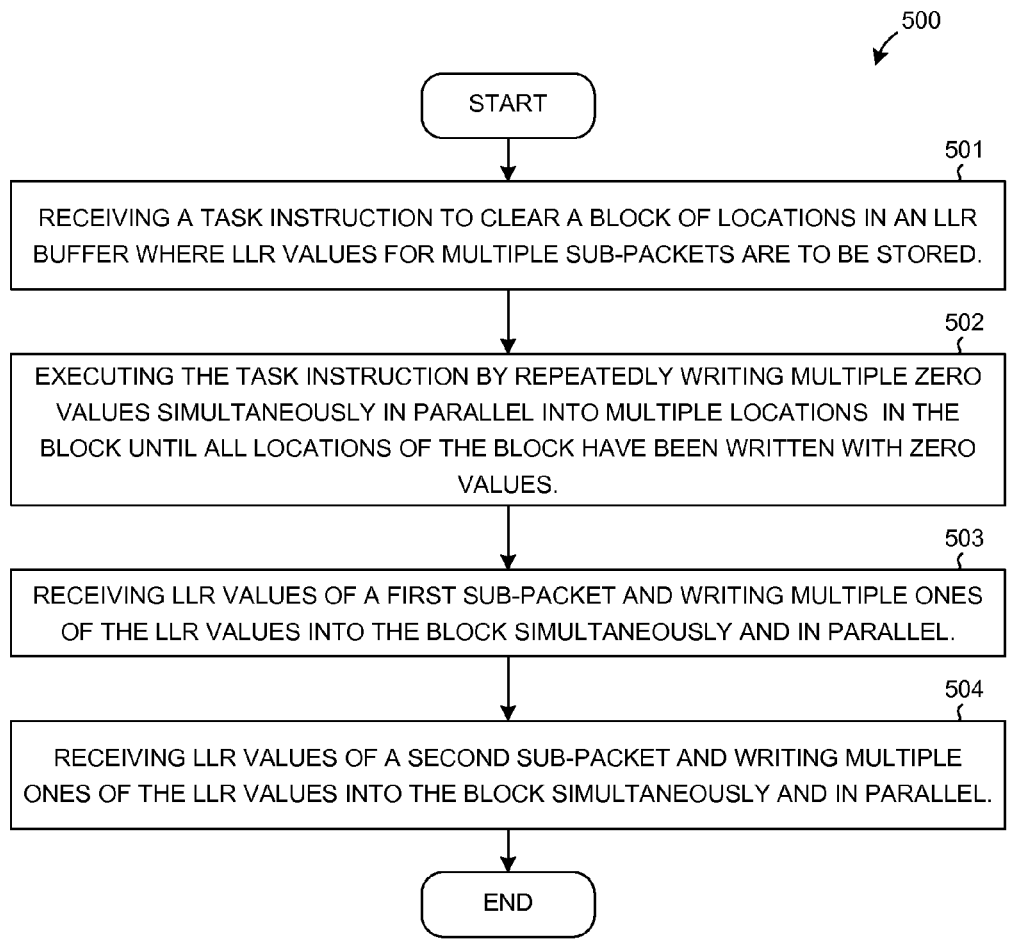
FIG. 21 is a flowchart of the method 500 set forth in FIG. 19 in accordance with the second novel aspect.

FIG. 21 is a flowchart of a method 500 set forth in FIG. 19. A task instruction is received (step 501) that identifies a block of memory locations (of a multi-banked segment of an LLR buffer) where LLR values for multiple sub-packets are to be stored. In one example, first sub-packet LLR values are to be stored into a first sub-packet region of the multi-banked memory of the LLR buffer, and second sub-packet LLR values are to be stored into a second sub-packet region of the multi-banked memory of the LLR buffer. The block of memory locations identified by the task instruction includes both the first and second sub-packet regions. The task instruction is then executed (step 502) by writing multiple locations with zero values in parallel, and this parallel writing is repeated until all locations of the block have been written with zero values. In one example, each location is a multi-bit word-location capable of holding multiple LLR values, and all the bits of the word-location are simultaneously written with zeros. LLR values of the first sub-packet are then written (step 503) into appropriate locations in the first sub-packet region in accordance with a de-interleaving scheme, multiple LLR values at a time in parallel. LLR values of the second sub-packet are written (step 504) into appropriate locations in the second sub-packet region in accordance with the de-interleaving scheme, multiple LLR values at a time in a parallel.

The techniques described herein may be implemented by various means. In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A method comprising:
   (a) generating a plurality of De-interleaved Reorder Physical (DRP) addresses; and
   (b) using the DRP addresses to simultaneously write a corresponding plurality of (Log-Likelihood Ratio) LLR values into a multi-banked memory, wherein the multi-banked memory comprises a plurality of banks, and wherein no more than one LLR value is written into each bank of the multi-banked memory at a time,
   wherein the DRP addresses are Pruned Bit Reversal Interleaved (PBRI) addresses.

2. The method of claim 1, wherein the generating of (a) involves:
   generating a stream of reorder indices, each reorder index including a plurality of address bits; and
   translating each reorder index into a corresponding DRP address by shifting second address bits of the reorder index and by leaving first address bits of the reorder index unshifted.

3. The method of claim 2, wherein the first address bits of the reorder index form a first portion of the DRP address, and wherein the first portion of the DRP address identifies one and only one bank of the multi-banked memory into which an LLR value is written.

4. The method of claim 3, wherein the second address bits of the reorder index after shifting form a second portion of the DRP address, and wherein the second portion of the DRP address identifies a word-location into which the LLR value is written.

5. The method of claim 1, further comprising:
   (c) reading the plurality of the LLR values out of the multi-banked memory such that the plurality of LLR values has a de-interleaved order.

6. The method of claim 5, wherein the reading of (c) involves reading a first subset of the plurality of LLR values out of a first bank of the multi-banked memory, and then reading a second subset of the plurality of LLR values out of a second bank of the multi-banked memory.

7. The method of claim 5, wherein the multi-banked memory is one of a plurality of segments of a multi-segment arbitrated memory, wherein LLR values of a first sub-packet are written into one of the segments during a time period that LLR values of a second sub-packet are read out of another of the segments by a decoder.

8. The method of claim 1, wherein each bank comprises a plurality of word-locations, and wherein a plurality of LLR values is written into at least one of the word-locations.

9. A method comprising:
   (a) generating a plurality of De-interleaved Reorder Physical (DRP) addresses, wherein the plurality of DRP addresses comprises a plurality of sets of DRP addresses;
   (b) using each set of DRP addresses to simultaneously write a corresponding set of (Log-Likelihood Ratio) LLR values into a memory; and
   (c) reading the plurality of LLR values out of the memory in a de-interleaved order,
   wherein the DRP addresses are Pruned Bit Reversal Interleaved (PBRI) addresses, and wherein the memory is a multi-banked memory.

10. An apparatus comprising:
    a de-interleaver circuit that generates a plurality of De-interleaved Reorder Physical (DRP) addresses; and
    a multi-banked memory that uses the plurality of DRP addresses to simultaneously write a plurality of LLR values into the multi-banked memory such that no more than one LLR value is written into each bank of the multi-banked memory at a time,
    wherein the DRP addresses are Pruned Bit Reversal Interleaved (PBRI) addresses.

11. The apparatus of claim 10, wherein the de-interleaver circuit comprises:
    a reorder index generator that generates a stream of reorder indices, each reorder index including a plurality of address bits; and
    an address translator circuit that receives the stream of reorder indices, and that converts each received reorder index into a corresponding DRP address, wherein the address translator circuit converts a reorder index into a DRP address by shifting first address bits of the reorder index and by leaving second address bits of the reorder index unshifted.

12. The apparatus of claim 11, wherein the second address bits identify a bank of the multi-banked memory that one of the LLR values is written into.

13. The apparatus of claim 11, wherein each of the plurality of DRP addresses identifies one and only one of the banks of the multi-banked memory into which a corresponding one of the plurality of LLR values is written.

14. The apparatus of claim 10, wherein the multi-banked memory comprises:
    a plurality of banks, wherein each bank includes a plurality of word-locations, wherein each LLR value includes a number of bits A, wherein each word-location includes a number of bits B, and wherein B is at least two times A.

15. The apparatus of claim 10, wherein the multi-banked memory is one of a plurality of segments of a multi-segment arbitrated memory, wherein LLR values of a first sub-packet are written into one of the segments during a time period that LLR values of a second sub-packet are read out of another of the segments.

16. An apparatus, comprising:
    a multi-banked memory comprising a plurality of banks; and
    means for using a plurality of De-interleaved Reorder Physical (DRP) addresses for writing a plurality of sets of Log Likelihood Ratio (LLR) values into the multi-banked memory, wherein the LLR values of each set are simultaneously written into the multi-banked memory such that no more than one LLR value is written into each bank of the multi-banked memory at a time,
    wherein the DRP addresses are Pruned Bit Reversal Interleaved (PBRI) addresses.

17. The apparatus of claim 16, further comprising:
    means for reading the LLR values out of the multi-banked memory in a de-interleaved order.

18. A computer program product, comprising:
    a non-transitory computer-readable medium comprising:
       code for causing a computer to control a de-interleaver such that the de-interleaver generates a plurality of De-interleaved Reorder Physical (DRP) addresses, and such that the DRP addresses are used to simultaneously write a corresponding plurality of (Log-Likelihood Ratio) LLR values into a multi-banked memory, wherein the multi-banked memory comprises a plurality of banks, and wherein no more than one LLR value is written into each bank of the multi-banked memory at a time; and
       code for causing the computer to control a decoder such that the decoder reads the plurality of LLR values out of the multi-banked memory in a de-interleaved order,
       wherein the DRP addresses are Pruned Bit Reversal Interleaved (PBRI) addresses.

19. A method comprising:
(a) clearing a plurality Log-Likelihood Ratio (LLR) values from a word-location in a memory by performing a single write operation,
wherein the word-location is one of a plurality of word-locations, and wherein all of the word-locations of the plurality of word-locations are cleared simultaneously,
wherein the memory is a multi-banked memory, and wherein each of the word-locations of the plurality of word-locations is a part of a different bank of the multi-banked memory, and
wherein an LLR value of a first sub-packet and an LLR value of a second sub-packet are both stored in the same bank of the multi-banked memory.

20. The method of claim 19, wherein a first of the LLR values of the plurality of LLR values is a first parity LLR value, and wherein a second of the LLR values of the plurality of LLR values is a second parity LLR value.

21. A method comprising:
(a) clearing a plurality Log-Likelihood Ratio (LLR) values from a word-location in a memory by performing a single write operation;
(b) interpreting an instruction; and
(c) in response to the interpreting of (b) performing step (a) multiple times such that a plurality of word-locations identified by the instruction is cleared.

22. The method of claim 21, wherein (c) involves clearing an LLR value of a first sub-packet from a first of the word-locations identified by the instruction, and (c) also involves clearing an LLR value of a second sub-packet from a second of the word-locations identified by the instruction.

23. The method of claim 21, wherein the memory includes a first sub-packet region and a second sub-packet region, and wherein (c) involves clearing word-locations of the first sub-packet region, and wherein (c) also involves clearing word-locations of the second sub-packet region.

24. An apparatus comprising:
a memory that stores a first Log-Likelihood Ratio (LLR) value and a second LLR value; and
a mechanism that clears the first and second LLR values simultaneously.

25. The apparatus of claim 24, wherein the first and second LLR values are simultaneously cleared by a single write operation.

26. The apparatus of claim 24, wherein the first and second LLR values are simultaneously cleared by multiple write operations that occur simultaneously.

27. The apparatus of claim 24, wherein the mechanism includes a task manager.

28. The apparatus of claim 24, wherein the mechanism receives an instruction, wherein the instruction identifies a plurality of word-locations in the memory, and wherein the mechanism causes the first and second LLR values to be cleared by writing to the identified plurality of word-locations.

29. The apparatus of claim 24, wherein the memory is a multi-banked memory, wherein the first LLR value is stored in a first bank of the multi-banked memory, and wherein the second LLR value is stored in a second bank of the multi-banked memory.

30. The apparatus of claim 24, wherein the first and second LLR values are stored in a single word-location of the memory.

31. An apparatus comprising:
a memory that stores a first Log-Likelihood Ratio (LLR) value and a second LLR value; and
means for clearing the first and second LLR values simultaneously.

32. The apparatus of claim 31, wherein the means clears the first and second LLR values simultaneously by performing a single write operation.

33. The apparatus of claim 31, wherein the means clears the first and second LLR values simultaneously by performing multiple write operations simultaneously.

34. A computer program product, comprising:
a non-transitory computer-readable medium comprising:
code for causing a computer to simultaneously clear a plurality of Log-Likelihood Ratio (LLR) values from a memory.

35. The computer program product of claim 34, wherein the code is a task instruction.

36. The computer program product of claim 34, wherein the code is for causing the computer to simultaneously clear the plurality of LLR values by performing a single write operation to a single word-location in the memory.

37. The computer program product of claim 34, wherein the code is for causing the computer to simultaneously clear the plurality of LLR values by performing multiple write operations simultaneously.

* * * * *